United States Patent [19]
Ohsumi

[11] Patent Number: 5,063,382
[45] Date of Patent: Nov. 5, 1991

[54] CONSTRUCTION FOR MOUNTING A CAP TO A MAGNETIC TYPE ROTARY ENCODER

[75] Inventor: Yasuhisa Ohsumi, Sendai, Japan

[73] Assignee: Alps Electric Co., Ltd., Tokyo, Japan

[21] Appl. No.: 574,708

[22] Filed: Aug. 29, 1990

[30] Foreign Application Priority Data

Nov. 22, 1989 [JP] Japan ............... 1-134863[U]

[51] Int. Cl.⁵ .............................................. H03M 1/22
[52] U.S. Cl. ................................. 341/15; 250/231.13
[58] Field of Search ............ 341/1, 12, 13, 14, 15; 250/231.13

[56] References Cited

U.S. PATENT DOCUMENTS

| | | | |
|---|---|---|---|
| 4,559,524 | 12/1985 | Suzuki | 341/13 |
| 4,768,119 | 8/1988 | Iijima et al. | 341/15 |
| 4,794,250 | 12/1988 | Togami | 250/231 S E |
| 4,843,388 | 6/1989 | Miyamoto | 341/15 |
| 4,942,295 | 7/1990 | Brunner et al. | 250/231.13 |

Primary Examiner—A. D. Pellinen
Assistant Examiner—Marc S. Hoff
Attorney, Agent, or Firm—Guy W. Shoup; David W. Heid

[57] ABSTRACT

Disclosed is a magnetic encoder comprising a rotational shaft on which a magnetic drum is provided, a first base provided with a bearing portion for rotatably supporting said rotational shaft, a second base mounted on said first base and provided with a sensor opposed to said magnetic drum, and a cap for covering said magnetic drum, said sensor and the like and having an open end edge secured to said first base.

2 Claims, 2 Drawing Sheets

CONSTRUCTION FOR MOUNTING A CAP TO A MAGNETIC TYPE ROTARY ENCODER

BACKGROUND OF THE INVENTION

1. Field of the Invention

The present invention relates to a magnetic type encoder, and particularly to a magnetic type encoder in which a mounting construction of a cap is improved.

2. Prior Art

FIG. 3 is an explanatory view showing a conventional magnetic type encoder. In this figure, a magnetic drum 1 has its surface magnetized in multi-polarity. The magnetic drum 1 is fixedly mounted on a rotational shaft 3 of a motor 2. The rotational shaft 3 is rotatably supported on a bearing portion 5 of a motor base 4, and the motor base 4 is fitted in and secured to a motor housing 6 for covering a rotor 12 of the motor 2. An encoder base 7 is fixed by screw B onto the motor base 4, and a sensor not shown is mounted on the encoder base 7. A mounting member 9 is bent around the sensor. A cap 10 covers the magnetic drum 1, the sensor and the like, and is fastened at its lower end to the mounting member 9 by screw 11.

In the above-described prior art, since the cap 10 is fixed by screw 8 to the encoder base 7, when an external force is applied to the cap 10, the encoder base 7 is also deviated from the rotational shaft 3. The sensor is mounted on the encoder base 7 in a spaced relation (gap) from the magnetic drum 1. However, when the gap is outside a predetermined range due to the aforementioned deviation, it is not possible to obtain an effective detection signal by the sensor.

SUMMARY OF THE INVENTION

The present invention has been achieved in order to solve the problem noted above with respect to prior art. An object of the present invention to provide a magnetic type encoder which can simplify the shape of parts and and can prevent an influence of an external force to the gap even if the external force is applied to the cap.

For achieving the aforesaid object, according to the present invention, there is provided a magnetic encoder comprising a rotational shaft on which a magnetic drum is provided, a first base provided with a bearing portion for rotatably supporting said rotational shaft, a second base mounted on said first base and provided with a sensor opposed to said magnetic drum, and a cap for covering said magnetic drum, said sensor and the like and having an open end edge secured to said first base.

With the arrangement as described above, the rotary shaft and the magnetic drum are provided on the first base through the bearing portion, and the sensor is provided on the first base through the second base. The external force applied to the cap is transmitted to the first base, but will not act so that the gap between the magnetic drum and the sensor is varied.

DETAILED DESCRIPTION OF THE PREFERRED EMBODIMENTS

Embodiments of the present invention will be described with reference to FIGS. 1 and 2.

Figure 1:
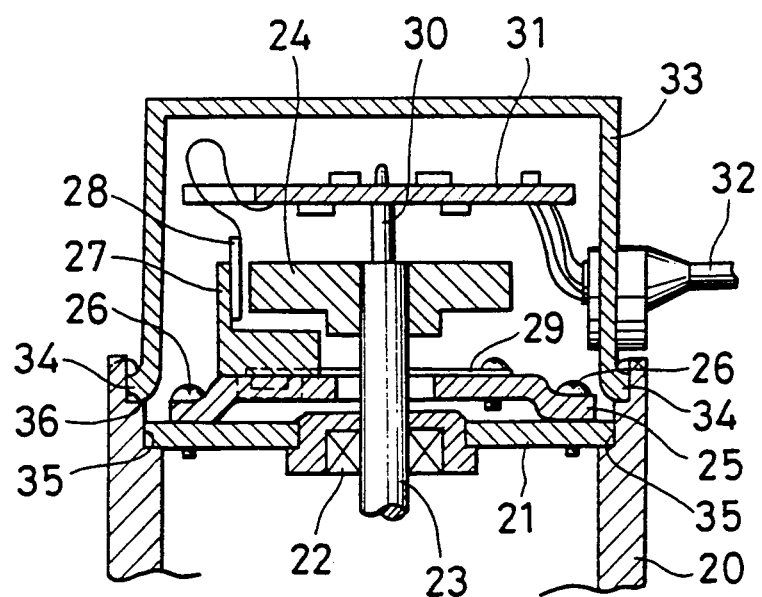
FIG. 1 is an explanatory view showing a first embodiment of a magnetic type encoder according to the present invention.

Referring to FIG. 1, a motor base 21 is fitted in and secured to a motor housing 20. In the central portion of the motor base 21, a rotational shaft 23 is rotatably supported by a bearing portion 22. A rotor (not shown) constituting a motor is provided below the rotational shaft 23. A magnetic drum 24 is fitted in and secured to the upper end of the rotational shaft 23. These motor housings 20 and motor base 21 constitute a first base.

An encoder base 25 is fixed by screw 26 onto the motor base 21, the encoder base 25 being provided with a guide 27. On the guide 27, a sensor 28 is disposed on the magnetic drum 24 in a spaced relation of a predetermined gap. A shield 29 is provided on the encoder base 25. A support post 30 is projected from the encoder base 25, and a base plate 31 is fitted in and secured to the upper surface of the support post 30. A circuit of the base plate 31 is connected to the sensor 28. The encoder base 25 constitutes a second base.

A cap 33 is formed into a cylindrical configuration with a bottom, and an open end edge 34 thereof is outwardly bended and fitted in an open end edge of the motor housing 20. The open end edge of the motor housing 20 is provided with a first recess shoulder 35 in which the motor base 21 is fitted, and a second shoulder 36 formed stepwise on the first recess shoulder 35. An open end edge 34 of the cap 33 is fitted in the second recess shoulder 36, and the upper end of the second recess shoulder 36 has its upper end caulked at several points so that the cap 33 and the motor housing 20 are formed into an integral configuration.

In the aforementioned first embodiment constructed as described above, the cap 33 is fixed to the motor housing 20 while being caulked. Therefore, even if an external force is applied to the cap 33, its force will not act so that the encoder base 25 is deviated from the motor base 21. In addition, even if the force applied to the motor housing is applied to the motor base 21 and a positional relation between the motor base 21 and the motor housing 20 should be deviated, the magnetic drum 24 and the sensor 28 are mounted on the motor base 21 and therefore, no deviation in positional relation between the magnetic drum 24 and the sensor 28 occurs. Accordingly, the cap can be maintained constant without being affected by the external force and the reliability of detection can be maintained.

Furthermore, it is not necessary to form a mounting member for mounting a cap on the encoder base 25 as experienced in prior art, thus simplifying the shape of the encoder base 25.

Moreover, since the cap 33 is caulked on the motor housing 20, time for assembly can be reduced as compared with screwing as in prior art.

Figure 2:
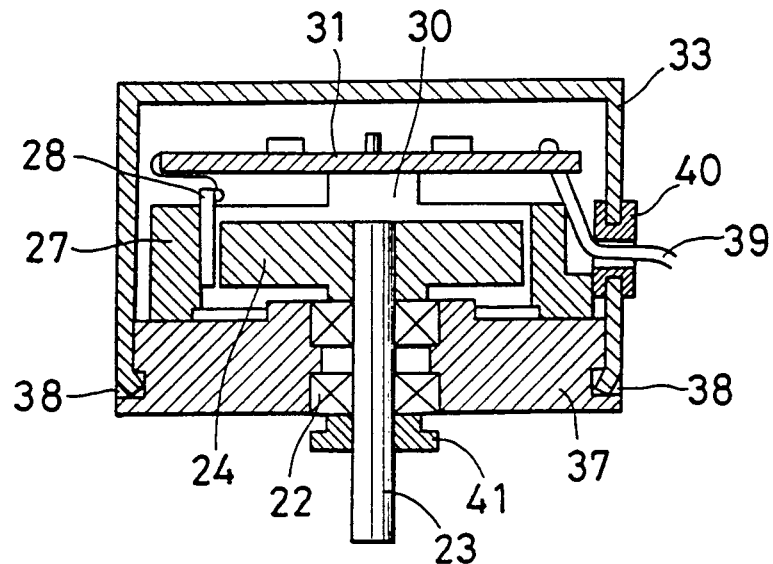
FIG. 2 is an explanatory view showing a second embodiment of a magnetic type encoder according to the present invention.
Figure 3:
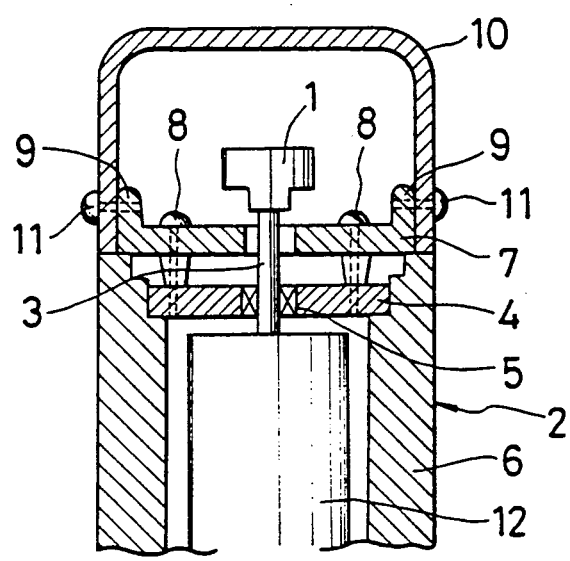
FIG. 3 is an explanatory view of a conventional magnetic type encoder.

FIG. 2 shows a second embodiment of a magnetic encoder according to the present invention. Parts which are the same as or corresponding to those shown in FIG. 1 are indicated by the same reference numerals as those used in FIG. 1, detailed description of which will not be made.

In the second embodiment, the rotational shaft 23 is of the type which is not a rotational shaft of a motor. The cap 33 is fitted in the outer peripheral surface of the housing 37 which forms a first base having a bearing portion 22. The lower end of the cap 33 is partly cut and bent and caulked at a recess 38 of the housing 37. Reference numeral 39 designates a harness extended from the base plate 31; 40 a bushing for extending the harness 39 outside; and 41 a spacer for pre-pressurizing the bearing portion 22.

The above-described second embodiment also has the operation and effect similar to those mentioned in the first embodiment.

While in the above-described embodiments, the cap 33 an the first base are caulked and fixed, it is to be noted that the present invention is not limited thereto but for example, screwing or the like can be used as a fixing means.

As described above, according to the present invention, shapes of parts can be simplified, and even if an external force is applied to a cap, an influence of the force on the cap can be prevented.

What is claimed is:

1. A construction for mounting a cap (33) having a first open edge (34) to a magnetic type rotary encoder, said rotary encoder comprising:
   a housing (20) defining a second open edge; and
   a base plate (21) disposed in said housing adjacent said second open edge; said construction for mounting comprising:
   a first shoulder (35) formed on an inside surface of said housing (20) adjacent said second open edge for receiving said base plate (21);
   a second shoulder (36) formed on said inside surface of said housing adjacent said second open edge for receiving said first open edge (34) of said cap (33); and
   caulking disposed on said housing (20) adjacent said second open edge such that said cap (33) is secured to said housing (20).

2. A construction for mounting a cap (33) having an open edge to a magnetic type rotary encoder, said rotary encoder comprising a housing (37); said construction comprising:
   said housing (37) defining a recess (38) on an outer surface thereof;
   said open edge of said cap (33) being bent such that it is disposed within said recess (38); and
   caulking disposed on said housing (37) over said open edge of said cap (33) such that said cap (33) is secured to said housing (37).

* * * * *